(12) United States Patent
Kawada

(10) Patent No.: US 8,071,482 B2
(45) Date of Patent: Dec. 6, 2011

(54) MANUFACTURING METHOD OF A SILICON CARBIDE SEMICONDUCTOR DEVICE

(75) Inventor: Yasuyuki Kawada, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 101 days.

(21) Appl. No.: 12/124,129

(22) Filed: May 20, 2008

(65) Prior Publication Data

US 2008/0293240 A1 Nov. 27, 2008

(30) Foreign Application Priority Data

May 21, 2007 (JP) ................................. 2007-133597

(51) Int. Cl.
*H01L 21/3065* (2006.01)
*H01L 21/302* (2006.01)

(52) U.S. Cl. ........ 438/704; 438/196; 438/197; 438/198; 438/570; 438/583; 438/584; 438/597; 438/652; 438/688; 438/689; 438/691; 438/700; 438/706; 438/735; 438/736; 438/739; 438/767; 438/931; 257/77; 257/78; 257/81; 257/103; 257/471; 257/486; 257/594; 257/750; 257/E21.159; 257/E21.215

(58) Field of Classification Search .................. 438/700, 438/702, 703, 704, 706, 717, 735, 736, 739, 438/745, 754, 196, 197, 198, 570–583, 584, 438/597, 652–688, 689, 691, 718, 767, 931; 257/E21.159, E21.215, 77, 78, 81, 103, 471–486, 257/594, 750
See application file for complete search history.

(56) References Cited

U.S. PATENT DOCUMENTS

| | | | | |
|---|---|---|---|---|
| 4,353,935 | A * | 10/1982 | Symersky | 438/670 |
| 2005/0250336 | A1* | 11/2005 | Komatani | 438/706 |
| 2007/0132105 | A1* | 6/2007 | Akram et al. | 257/774 |
| 2007/0207614 | A1* | 9/2007 | Kosaka et al. | 438/689 |
| 2007/0247048 | A1* | 10/2007 | Zhang et al. | 313/311 |
| 2008/0218840 | A1* | 9/2008 | Qui et al. | 359/276 |

FOREIGN PATENT DOCUMENTS

| | | |
|---|---|---|
| JP | 2005-56868 A | 3/2005 |
| JP | 2005-322811 A | 11/2005 |
| JP | 2006-228901 A | 8/2006 |
| WO | 02/099870 A1 | 12/2002 |

OTHER PUBLICATIONS

Jiang et al., Impact of Ar addition to inductively coupled plasma etching of SiC in SF6/O2; Microelectronic Engineering 73-74 (2004) p. 306-311.*
S. Tanaka et al., Deep reactive ion etching of silicon carbide; J. Vac. Sci. Technol. B 19(6) Noc/Dec. 2001, p. 2173-2176.*
M. Lazar et al., Deep SiC etching with RIE; Superlattices and Microstructures 40 (2006), p. 388-392.*
N. Camara et al., Study of the reactive ion etching of 6H-SiC and 4H-SiC in SF6/Ar plasmas by optical emission spectroscopy and laser interferometry; Solid-State Electronics 46 (2002), p. 1959-1963.*
A. Syrkin et al., Reactive ion etching of 6H-SiC in an ECR plasma CF4-O2 mixtures using both Ni and Al masks; Materials Science and Engineering B46 (1997), p. 374-378.*
IBM-TDB; Chang K, Chiu GT, Hoeg, AJ; Method for Controlling Via Sidewall Slope; TDB 04-80 p. 4883-4885; Apr. 1, 1980. (IPCOMOM000054789D). IP.com electronic publication Feb. 13, 2005 p. 1-3.*

* cited by examiner

*Primary Examiner* — N Drew Richards
*Assistant Examiner* — John P Dulka
(74) *Attorney, Agent, or Firm* — Rossi, Kimms & McDowell LLP

(57) ABSTRACT

A manufacturing method for a silicon carbide semiconductor device is disclosed. It includes an etching method in which an Al film and Ni film are laid on an SiC wafer in this order and wet-etched, whereby a two-layer etching mask is formed in which Ni film portions overhang Al film portions. Mesa grooves are formed by dry etching by using this etching mask.

8 Claims, 5 Drawing Sheets

MANUFACTURING METHOD OF A SILICON CARBIDE SEMICONDUCTOR DEVICE

CROSS REFERENCE TO RELATED APPLICATIONS

This application claims priority from Japanese application Serial No. 2007-133597, filed on May 21, 2007, the contents of which are incorporated herein by reference in their entirety.

BACKGROUND OF THE INVENTION

A. Field of the Invention

The present invention relates to a manufacturing method of a silicon carbide (hereinafter abbreviated as SiC) semiconductor device for high breakdown voltage and large current uses. More specifically, the invention relates to a manufacturing method including a dry etching method for forming a mesa groove having a junction end portion surface which surrounds an active portion where a main current flows in a power semiconductor device such as a diode or a MOSFET which uses a SiC semiconductor substrate.

B. Description of the Related Art

Power MOSFETs, IGBTs, etc. are known and widely used as silicon (hereinafter referred to as Si) power semiconductor devices which are used in inverters and for AC power control and other purposes. However, in recent years, Si as a semiconductor material has come to be used frequently in ranges that are close to its material property limits in terms of power device semiconductor characteristics. As a result, SiC, which is a semiconductor material whose material property limits are higher than those of Si has attracted a great deal of attention. SiC materials (in particular, the one having a 4H—SiC crystal form) have features that the dielectric breakdown electric field is one-order higher, the band gap is 2.9 times larger, the thermal conductivity is 3.2 times higher, and the temperature of transition to an intrinsic semiconductor is 3 to 4 times higher than those of Si. Therefore, the material properties of SiC, the limits of which are higher than those of Si, are exercised greatly, particularly when SiC is used as a substrate material for a power device. As a result, it is expected that power devices having an SiC substrate can satisfy both high breakdown voltage and low on-resistance, which is difficult for Si devices because of a tradeoff relationship between these two parameters. As such, in recent years, many approaches to implementing such SiC devices as products have come to be made.

Techniques relating to manufacturing methods, including etching for putting into practical use or implementing as products power devices using wide-band-gap semiconductor materials such as SiC, are disclosed in JP-A-2005-322811 (corresponding to US 2005/0250336 A1), JP-A-2005-56868 (corresponding to which WO 02/099870 A1), and JP-A-2006-228901. JP-A-2005-322811 relates to a dry etching mask and discloses a manufacturing method which can increase the adhesion of an etching mask to a GaN semiconductor substrate and enables high-accuracy groove formation. JP-A-2005-56868 discloses a method to prevent occurrence of micro-trenches (which tend to cause reduction in breakdown voltage) in dry-etching a SiC substrate in which dry etching using an Al mask and full-surface dry etching (which is performed after removing the Al mask) are combined. JP-A-2006-228901 has a statement to the effect that to prevent reduction in breakdown voltage at top corners of trenches formed in a SiC substrate by etching, trench top corners are rounded by performing isotropic etching after increasing the thickness of oxide films formed on the trench bottoms.

However, actual manufacturing processes for putting into practice or implementing as products SiC power devices still have many and various problems to be solved. One specific problem resides in a process of forming, for example, a trench for a trench gate or a mesa groove having a junction end portion surface which surrounds a device active portion by dry etching in manufacturing a device using a SiC substrate. That is, in dry etching a SiC substrate, if kinds of gases used for the etching and various etching conditions (ICP (induction-coupled plasma) power, bias power, gas pressure, and gas flow rates) are not controlled properly, an etching failure occurs because an etching mask material is stuck to an etching subject material (formation of micro-masks) during dry etching of mesa grooves or micro-trenches are formed (i.e., small grooves are formed by excessive etching at bottom corners of recesses formed by the etching). This is problematic for the following reason. If such micro-masks or micro-trenches are formed, acute-angled portions tend to be formed in the etching surfaces of a mesa groove. If such acute-angled portions are formed in the surfaces of a mesa groove, an electric field is concentrated which makes any resulting device prone to dielectric breakdown. That is, the breakdown voltage of the device cannot be increased.

Usually, in manufacture of a high-breakdown-voltage device using a SiC substrate or some other substrate such as a Si substrate, the etching surface is required to be as free of acute-angled portions as possible when a mesa groove is formed by etching. To this end, a method is employed in which the mesa groove formation in a SiC substrate by dry etching is done in two stages having different sets of etching conditions to suppress generation of micro-trenches as mentioned above. For example, etching is performed at a relatively high etching rate at the first stage and then the etching rate is lowered to obtain a smooth final etched shape. However, this two-stage etching method has problems because the process is complex and there still remains some doubt about its reproducibility.

The present invention is directed to overcoming or at least reducing the effects of one or more of the problems set forth above.

SUMMARY OF THE INVENTION

The present invention has been made in view of the above problems, and an object of the invention is therefore to provide a manufacturing method of a silicon carbide semiconductor device including a dry etching method which is necessary in manufacturing a high-breakdown-voltage device and which can increase the breakdown voltage by suppressing generation of micro-masks and thereby produce smoothly curved etched surfaces in forming a mesa groove which is as deep as 10 μm or more and reaches a SiC substrate past a drift layer.

In the invention, an Al film and a Ni film are laid on an SiC substrate in this order and wet-etched, whereby a two-layer etching mask is formed in which a Ni film portion overhangs an Al film portion. When a mesa groove is formed by dry etching using this etching mask, the rate of incidence of ions of an etching gas on the groove side walls and their vicinities is lowered by virtue of the Ni film portion which overhangs the Al film portion. This reduces the degree of a phenomenon that deep sub-trenches tend to be formed locally in the groove side walls and in their vicinities, and thereby provides an advantage that the breakdown voltage is increased.

The invention provides a manufacturing method of a silicon carbide semiconductor device, comprising a dry etching step of forming, by dry etching, a mesa groove as deep as 10 μm or more in a silicon carbide semiconductor substrate using, as an etching mask patterned on the silicon carbide semiconductor substrate, a metal lamination film formed by an Al film and a Ni film in such a manner that a Ni film portion covers and overhangs an Al film portion and also using an etching gas which is an induction-coupled plasma obtained by ionizing a mixed gas of $SF_6$, $O_2$, and Ar gases, under conditions that the $SF_6$, $O_2$, and Ar gases are caused to flow at flow rates of 26% to 35%, 7.5% to 8.5%, and 58% to 65% with respect to a total gas flow rate, respectively, temperature of the silicon carbide semiconductor substrate is 30° C.±5° C., and pressure is kept at 3 Pa or more.

It is preferable that the induction-coupled plasma power and bias power of the dry etching apparatus using the induction-coupled plasma be 500 W and 15 W, respectively.

It also is preferable that the total thickness of the metal lamination film be 0.5 to 2 μm. It is also preferable that the metal lamination film be formed by forming the Al film at a thickness of 30% to 50% of the total thickness and then forming the Ni film on the Al film at a thickness of 50% to 70% of the total thickness.

It is preferable that the metal lamination film be pattern-formed with a wet etching liquid which etches the Al film at a higher etching rate than the Ni film.

Furthermore, it is preferable that the wet etching liquid be a mixed acid including phosphoric acid, nitric acid, and acetic acid.

As such the invention can provide a manufacturing method of a silicon carbide semiconductor device including a dry etching method which is necessary in manufacturing a high-breakdown-voltage device and which can increase the breakdown voltage by suppressing generation of micro-masks and thereby producing smoothly curved etched surfaces in forming a mesa groove which is as deep as 10 μm or more and reaches a SiC substrate past a drift layer.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

A manufacturing method of a silicon carbide semiconductor device according to an embodiment of the invention will be hereinafter described in detail with reference to the drawings. Various changes and modifications to the following embodiment are possible without departing from the spirit and scope of the invention.

Figure 1:
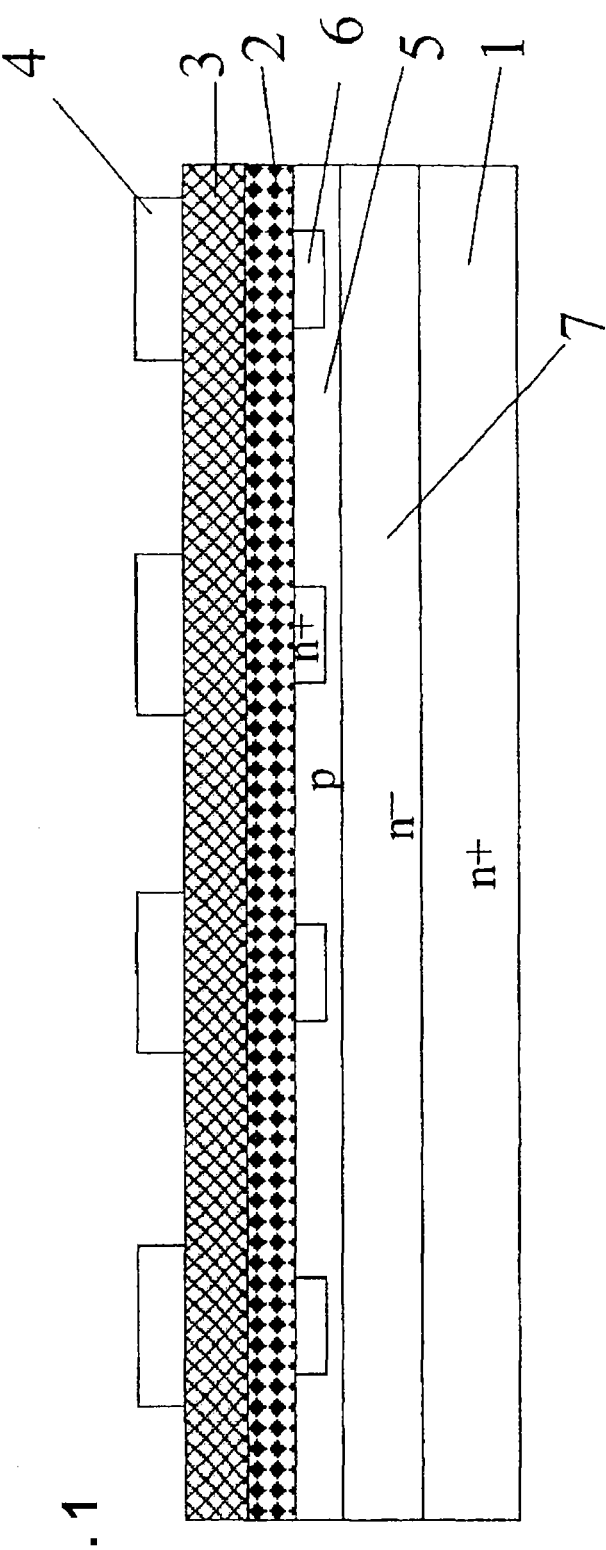
FIG. 1 is a sectional view of a silicon carbide wafer and shows a photoresist pattern.
Figure 2:
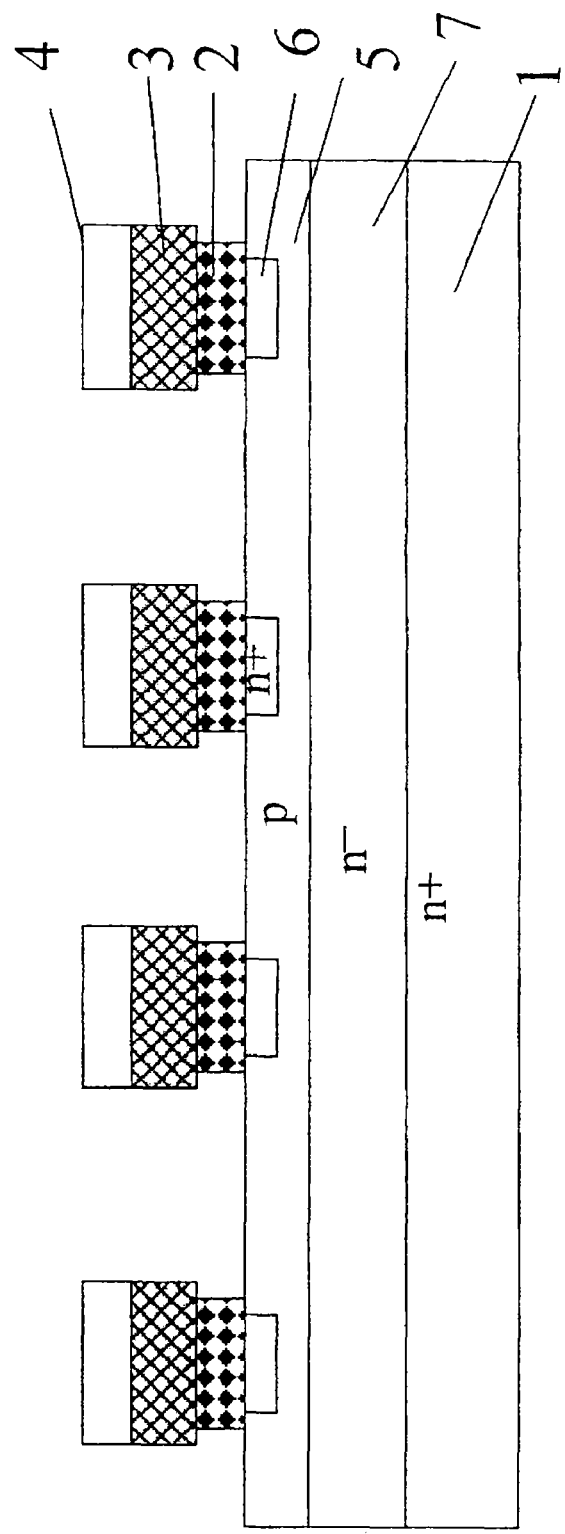
FIG. 2 is a sectional view of the silicon carbide wafer and shows a pattern of an etching mask which is a metal lamination film.
Figure 4C:
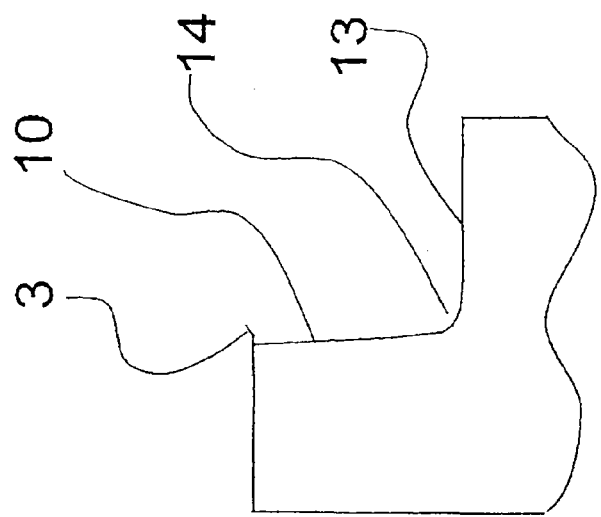
FIGS. 4A through 4C are sectional views of silicon carbide wafers which show respective etched shapes corresponding to Etching Condition 7 to Etching Condition 9, respectively.
Figure 4B:
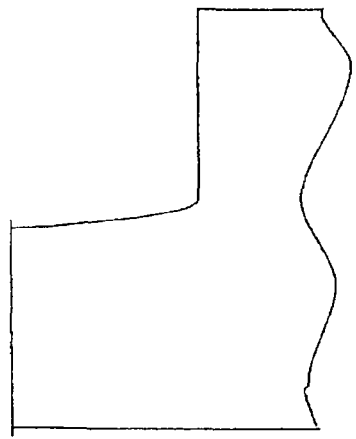
Figure 4A:
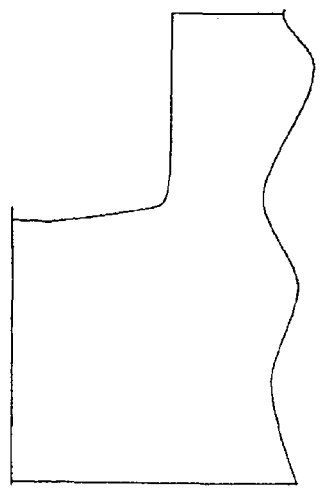
Figure 5:
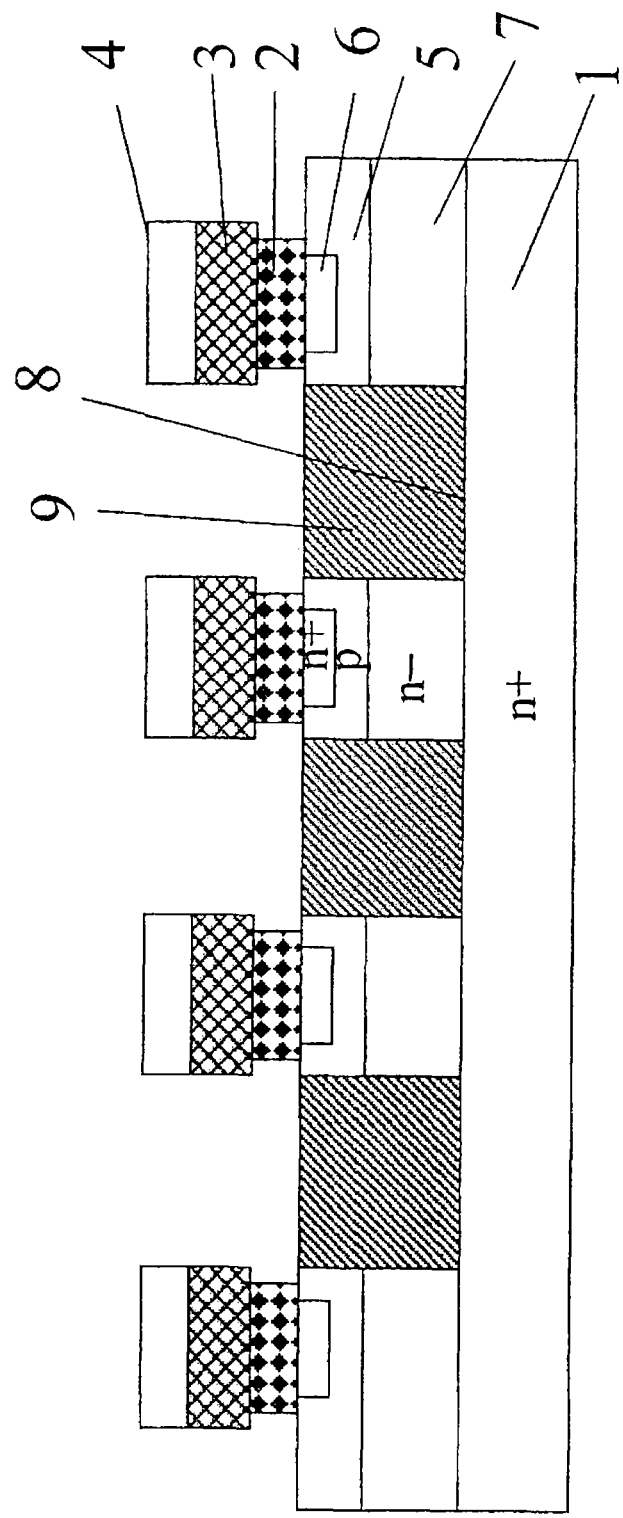
FIG. 5 is a sectional view of the silicon carbide wafer which is formed with mesa grooves.

FIG. 1 is a sectional view of a silicon carbide wafer and shows a photoresist pattern. FIG. 2 is a sectional view of the silicon carbide wafer and shows a pattern of an etching mask which is a metal lamination film. FIGS. 3A through 3F are sectional views of silicon carbide wafers and shows respective etched shapes corresponding to Etching Condition 1 to Etching Condition 6, respectively. FIGS. 4A through 4C are sectional views of silicon carbide wafers which show respective etched shapes corresponding to Etching Condition 7 to Etching Condition 9, respectively. FIG. 5 is a sectional view of the silicon carbide wafer which is formed with mesa grooves.

As shown in FIG. 1, $n^+$ single crystal SiC substrate 1 having a (0001) Si surface as the major surface is prepared and n-type layer (n-type drift layer) 7 of 10 μm in thickness and $1 \times 10^{16}$ $cm^{-3}$ in impurity concentration is epitaxially grown thereon by thermal CVD. Alternatively, n-type drift layer 7 may be formed by implanting ions into an epitaxial layer. P-type base layer 5 and $n^+$ source regions 6 are formed on n-type drift layer 7 by epitaxial growth or ion implantation, whereby a silicon carbide (SiC) wafer is obtained. P-type base layer 5 is 1 μm in thickness and $1 \times 10^{17}$ $cm^{-3}$ in impurity concentration, and $n^+$ source regions 6 are 0.5 μm in junction depth and $1 \times 10^{19}$ $cm^{-3}$ in impurity concentration. Although any hexagonal-system silicon carbide materials can be used as the single crystal SiC substrate 1, 4H—SiC is preferable in terms of mobility. It is preferable to use nitrogen (N) as the donor of n-type drift layer 7 and $n^+$ source regions 6 and to use aluminum (Al) as the acceptor of p-type base layer 5.

MOSFETs, IGBTs, etc. can be produced by forming trenches having a depth of about 2 μm from the surfaces of $n^+$ source regions 6 by known dry etching or the like and forming a gate insulating film, gate electrodes, etc. The MOS structure may be a planar gate structure in which the gate insulating film is formed parallel with the wafer major surface, instead of the above trench gate structure. Since these MOS structures are well known, they will not be described further here. A diode may be formed by not forming $n^+$ source region 6.

Al film 2 and Ni film 3 are sequentially formed as an etching mask by sputtering, for example, on the SiC wafer in which p-type base layer 5 and $n^+$ source regions 6 have been formed in the above-described manner. These metal films may be formed by known methods. The use of Ni film 3 is preferable because it provides a large selective etching ratio with SiC substrate 1 and hence the side walls of mesa grooves 8 can be made almost perpendicular to the surface of the SiC wafer in forming mesa grooves 8 by dry etching. Al film 2 is used because it is etched at a higher rate than Ni film 3 and hence lamination structures are formed in such a manner that Ni film portions 3 overhang Al film portions 2 (see FIG. 2) when a mask pattern is formed. The thicknesses of Al film 2 and Ni film 3 are 0.4 μm and 0.6 μm, respectively.

After the SiC wafer is cleaned, it is dried at 120° C. for 10 minutes. Then, after the SiC wafer is left as it is in an atmosphere such as a vapor of hexamethyldisilazane (OAP: trade name of Tokyo Ohka Kogyo Co., Ltd.) to increase the degree of adhesion to a photoresist, photoresist 4 is applied to Ni film 3. Then, photoresist 4 is soft-baked by processing the SiC wafer in an oven at 100° C. for 10 minutes. After the baking, exposure is performed with an ultraviolet exposing apparatus using an etching mask having an arbitrary pattern. After the exposure, unnecessary portions of photoresist 4 are removed by development and hard baking is performed at 125° C. for 20 minutes, whereby a photoresist pattern as shown in the sectional view of FIG. 1 is formed. In this state, the thickness of photoresist 4 is about 2.5 μm. There are no problems even if photoresist 4 has other thickness values, as long as it is thick enough to withstand wet etching.

After the formation of the photoresist pattern, the SiC wafer is immersed in an etching liquid which is a mixed acid of phosphoric acid, nitric acid, and acetic acid capable of pattern-etching Ni film 3 and Al film 2 (the etching liquid is heated to a prescribed temperature), whereby Ni film 3 and Al film 2 are wet-etched. As a result, an etching mask which is a Ni film/Al film lamination layer in which Ni film portions overhang Al film portions is formed as shown in the sectional view of FIG. 2. The shape that Ni film portions overhang Al film portions is formed as shown in the sectional view of FIG. 2 because, as mentioned above, the mixed acid etches Al film 2 faster than Ni film 3. After the wet etching of Ni film 3 and Al film 2, photoresist 4 is removed by immersing the SiC wafer into a photoresist stripper. Openings of the etching mask are formed so as to surround the active portions of devices on the wafer, respectively. Line width errors produced by the wet etching, which is not high in accuracy, do not cause serious problems because the width (area) of mesa grooves 8 (having junction end portion surfaces which influence the device breakdown voltage) to be formed by dry etching is greater than that of trench gate grooves. After the formation of the etching mask, water cleaning and drying are performed and the SiC (or SiC film) is subjected to dry etching in the following manner.

ICP power and bias power are applied to the SiC wafer at a pressure of 3 Pa in a mixed gas atmosphere including $SF_6$, $O_2$, and Ar, whereby mesa grooves 8 are formed which reach SiC substrate 1 penetrating through p-type base layer 5 and n-type drift layer 7. The depth of mesa grooves 8 should be 10 μm or more in the case where the thickness of n-type drift layer 7 is 10 μm. This is to maintain a high breakdown voltage. That is, mesa grooves 8 should be deep enough (i.e., deeper than the low-impurity-concentration n⁻ drift layer 7) to prevent depletion layers (which develop when a voltage close to a breakdown voltage is applied) from reaching the bottoms of mesa grooves 8. It is necessary that mesa grooves 8 be filled later with a proper insulating material 9 such as polyimide, $SiO_2$, silicon nitride, or polysilicon. One method for cutting the wafer into chips of respective devices is that wide mesa grooves 8 are formed and the wafer is cut at the centers of the mesa grooves. In another cutting method, in which cutting lines are set on the SiC wafer surface, ring-like mesa grooves 8 are formed for respective devices on the wafer.

Next, experiments will be described that were carried out to determine optimum etching conditions for forming mesa grooves 8 to maintain a high breakdown voltage by dry-etching the above-described SiC wafer. This will be described especially in detail because the optimum etching conditions for forming mesa grooves 8 for maintaining a high breakdown voltage is an important feature of the invention.

Experiments in which the conditions of the dry etching of the SiC (or SiC film) were varied were carried out after the water cleaning and drying of the SiC wafer bearing the etching mask. More specifically, to determine optimum etching conditions, an ICP plasma dry etching apparatus and an $SF_6$/$O_2$/Ar mixed gas were used and the etching conditions were varied in the following manner. Table 1 shows selective ratios (i.e., ratios of the SiC etching rate to the etching mask etching rate) which were obtained when the etching conditions (kinds of gases, flow rates, ICP power, bias power, pressure, and temperature) were varied.

TABLE 1

| | Gases and flow rates (sccm) | ICP power (W) | Bias power (W) | Pressure (Pa) | Temperature (° C.) | Selective ratio |
|---|---|---|---|---|---|---|
| Condition 1 | SF6/O2/Ar = 30/10/0 | 500 | 50 | 3 | 30 | 9.7 |
| Condition 2 | SF6/O2/Ar = 30/10/0 | 500 | 15 | 3 | 30 | 16.7 |
| Condition 3 | SF6/O2/Ar = 10/3.3/25 | 500 | 50 | 3 | 30 | x |
| Condition 4 | SF6/O2/Ar = 10/3.3/25 | 500 | 50 | 3 | 75 | x |
| Condition 5 | SF6/O2/Ar = 10/3.3/25 | 500 | 50 | 0.5 | 75 | x |
| Condition 6 | SF6/O2/Ar = 10/3.3/25 | 500 | 15 | 0.5 | 75 | 11 |

In Table 1, mark "x" in the column of selective ratio means that the mask could not bear the etching and the SiC substrate surface under the mask was etched.

Figure 3A:
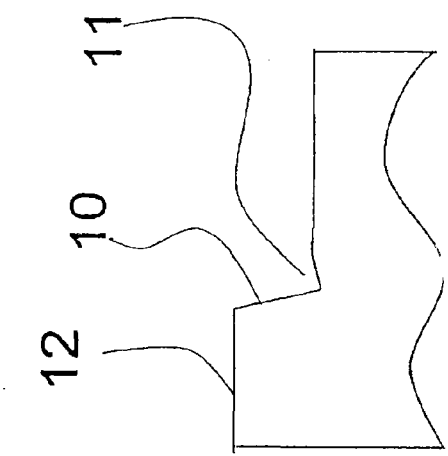
FIGS. 3A through 3F are sectional views of silicon carbide wafers which show respective etched shapes corresponding to Etching Condition 1 to Etching Condition 6, respectively.
Figure 3B:
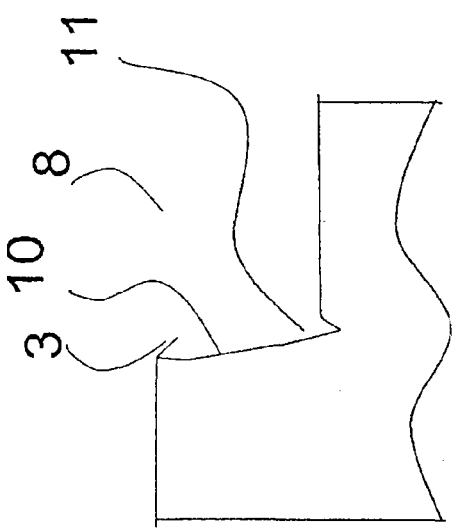

FIGS. 3A to 3F (sectional views) show etched shapes corresponding to Condition 1 to Condition 6, respectively. When the bias power was reduced from 50 W to 15 W (from Condition 1 to Condition 2 in Table 1), the selective ratio was improved from 9.7 to 16.7. As shown in FIGS. 3A and 3B, micro-trenches (sub-trenches) 11 at the bottoms of side walls 10 of mesa grooves 8 decreased. Reference symbol 3 denotes Ni film 3 of the etching mask.

Figure 3C:
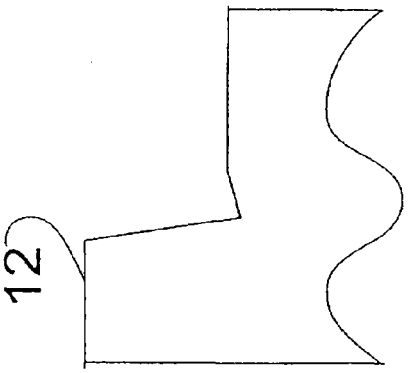

When the flow rates of $SF_6$ and $O_2$ were lowered from 30 sccm and 10 sccm to 10 sccm and 3.3 sccm with their ratio approximately fixed at 3:1 and Ar was added (flow rate: 25 sccm) (from Condition 1 to Condition 3), as shown in FIG. 3C, the etching mask could not bear the etching and SiC substrate surface 12 under the mask was etched down and the height of side walls 10 was shortened. However, as seen from FIGS. 3A, 3B and 3C, micro-trenches 11 were smaller than in the case of Condition 1 (the bias power remained the same (50 W)). This is an advantage of the addition of Ar.

Figure 3D:
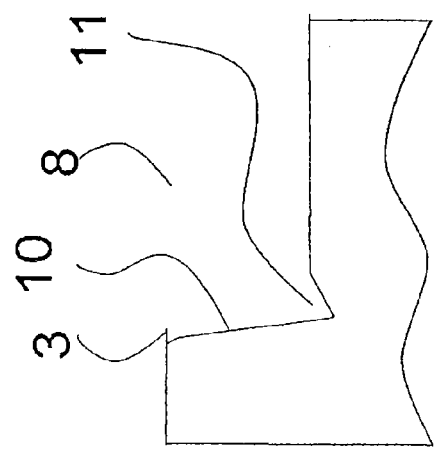

It is seen from Condition 3 and Condition 4 that the change in the temperature at the time of etching did not cause any improvement in the selective ratio (also see FIGS. 3C and 3D).

No improvement was found in the selective ratio either by lowering the pressure from 3 Pa to 0.5 Pa (from Condition 4 to Condition 5). SiC substrate surface 12 under the mask was etched down and the height of side walls 10 was shortened as shown FIGS. 3D and 3E.

Figure 3E:
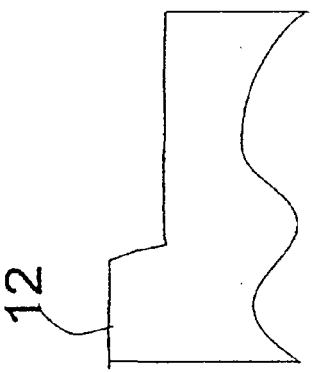
Figure 3F:
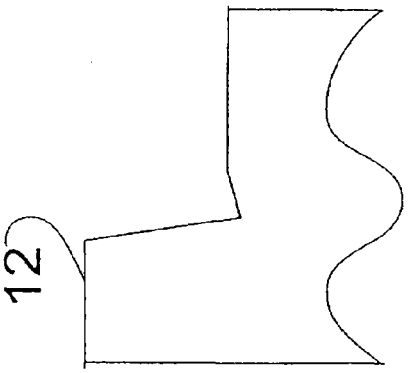

When the bias power was lowered from 50 W to 15 W in the state that Ar was added and the temperature was kept at 75° C. (from Condition 5 to Condition 6), the selective ratio was improved, whereby the etching rate of the etching mask was lowered and SiC substrate surface 12 under the mask was not etched down as shown in FIGS. 3E and 3F.

The above results show that as for the etching conditions it is proper to add Ar, not to increase the temperature from 30° C., not to lower the pressure from 3 Pa, and set the bias power low (15 W).

In the two-layer (Ni film 3/Al film 2) etching mask according to the embodiment, it is intended to suppress occurrence of micro-trenches 11 by utilizing the overhanging of Ni film portions 3. However, when the SiC wafer is etched to form 10-μm-deep grooves, for example, the overhanging of Ni film portions 3 is meaningless unless a selective ratio is realized which can leave Ni film portions 3. In the embodiment, since Ni film 3 is 0.6 μm in thickness, calculation shows that the selective ratio should be 16.6 or more.

Next, a description will be made of a study that was made to adjust the $SF_6/O_2$ ratio to improve the selective etching ratio. Table 2 shows selective ratios that were obtained when the $SF_6/O_2$ ratio was varied.

TABLE 2

|  | Gases and flow rates (sccm) | ICP power (W) | Bias power (W) | Pressure (Pa) | Temperature (°C.) | Selective ratio |
| --- | --- | --- | --- | --- | --- | --- |
| Condition 7 | SF6/O2/Ar = 6/3.3/25 | 500 | 15 | 3 | 30 | 14.6 |
| Condition 8 | SF6/O2/Ar = 10/3.3/25 | 500 | 15 | 3 | 30 | 17.7 |
| Condition 9 | SF6/O2/Ar = 15/3.3/25 | 500 | 15 | 3 | 30 | 19.5 |

FIGS. 4A to 4C (sectional views) show etched shapes corresponding to Condition 7 to Condition 9 of Table 2, respectively. It is seen from Table 2 that the selective ratio can be improved to 19.5 by increasing the $SF_6/O_2$ ratio to 15:3.3 (Condition 9). Calculation shows that with this selective ratio Ni film portions 3 remain even if the SiC wafer is etched to form 11.7-μm-deep grooves. It is seen from FIG. 4C (sectional view) that the intersecting portion 14 of etched side wall 10 and bottom 13 is made much gentler by virtue of the $SF_6/O_2$ ratio 15:3.3 in condition 9. Overhanging portions of the etching mask remained surely, and it seems that these overhanging portions caused ions that contribute to the etching of end portions to be less prone to concentrate there. Even Condition 8 can be employed because the selective ratio was increased from the above-mentioned value of 16.6 to 17.7.

It is concluded from the above results that employing the two-layer (Ni film 3/Al film 2) etching mask having the overhanging Ni film portions 3 and using Etching Conditions 8 and 9 in Table 2 make it possible to form, in an SiC wafer, mesa grooves 8 which are free of micro-masks or micro-trenches 11 and have smooth etched shapes (without acute-angled portions). In manufacturing a silicon carbide semiconductor device, these etching conditions reduce the degree of electric field concentration at junction end portion surfaces of mesa grooves 8 which determine the breakdown voltage of the device. An optimum manufacturing method capable of increasing the breakdown voltage can thus be realized.

Thus, a method of manufacturing a silicon carbide semiconductor device has been described according to the present invention. Many modifications and variations may be made to the techniques and structures described and illustrated herein without departing from the spirit and scope of the invention. Accordingly, it should be understood that the methods described herein are illustrative only and are not limiting upon the scope of the invention.

What is claimed is:

1. A manufacturing method of a silicon carbide semiconductor device, comprising:
    depositing an Al film and an Ni film in that order to form a metal lamination film on a SiC semiconductor substrate;
    etching the metal lamination film to produce a metal lamination mask in which Ni film portions cover and overhang Al film portions; and then
    etching a mesa groove at least 10 μm deep in the silicon carbide substrate using an induction-coupled plasma obtained by ionizing a mixed gas of $SF_6$, $O_2$, and Ar gases, under conditions that the $SF_6$, $O_2$, and Ar gases are caused to flow at flow rates of 26% to 35%, 7.5% to 8.5%, and 58% to 65% with respect to a total gas flow rate, respectively, wherein the temperature of the silicon carbide semiconductor substrate is 30° C.±5° C. and pressure is kept at 3 Pa or more.

2. The manufacturing method of a silicon carbide semiconductor device according to claim 1, wherein induction-coupled plasma power and bias power of a dry etching apparatus using the induction-coupled plasma are 500 W and 15 W, respectively.

3. The manufacturing method of a silicon carbide semiconductor device according to claim 2, wherein a total thickness of the metal lamination film is 0.5 to 2 μm.

4. The manufacturing method of a silicon carbide semiconductor device according to claim 3, wherein the metal lamination film is formed by forming the Al film at a thickness of 30% to 50% of the total thickness and then the Ni film is formed on the Al film at a thickness of 50% to 70% of the total thickness.

5. The manufacturing method of a silicon carbide semiconductor device according to claim 4, wherein the metal lamination film is patterned with a wet etching liquid which etches the Al film at a higher etching rate than the Ni film.

6. The manufacturing method of a silicon carbide semiconductor device according to claim 5, wherein the wet etching liquid is a mixed acid including phosphoric acid, nitric acid, and acetic acid.

7. A manufacturing method of a silicon carbide semiconductor device, comprising:
    depositing an Al film and an Ni film in that order to form a metal lamination film on a SiC semiconductor substrate;
    etching the metal lamination film to produce a metal lamination mask in which Ni film portions cover and overhang Al film portions; and then
    etching a mesa groove at least 10 μm deep in the silicon carbide substrate using an induction-coupled plasma obtained by ionizing a mixed gas of $SF_6$, $O_2$, and Ar gases, under conditions that the $SF_6$, $O_2$, and Ar gases are caused to flow at flow rates of 26% to 35%, 7.5% to 8.5%, and 58% to 65% with respect to a total gas flow rate, respectively, wherein the temperature of the silicon carbide semiconductor substrate is 30° C.±5° C. and pressure is kept at 3 Pa or more,
    wherein overhanging portions of the Ni film remain after the mesa groove is etched.

8. A manufacturing method of a silicon carbide semiconductor device, comprising:
    depositing an Al film directly on a SiC semiconductor substrate;
    depositing an Ni film on the deposited Al flim, to form a metal lamination film;

etching the metal lamination film to produce a metal lamination mask in which Ni film portions cover and overhang Al film portions; and then etching a mesa groove at least 10 μm deep in the silicon carbide substrate using an induction-coupled plasma obtained by ionizing a mixed gas of $SF_6$, $O_2$, and Ar gases, under conditions that the $SF_6$, $O_2$, and Ar gases are caused to flow at flow rates of 26% to 35%, 7.5% to 8.5%, and 58% to 65% with respect to a total gas flow rate, respectively, wherein the temperature of the silicon carbide semiconductor substrate is 30° C.±5° C. and pressure is kept at 3 Pa or more.

* * * * *